(12) United States Patent
Johnson

(10) Patent No.: US 6,603,784 B1
(45) Date of Patent: Aug. 5, 2003

(54) MECHANICAL STABILIZATION OF LATTICE MISMATCHED QUANTUM WELLS

(75) Inventor: Ralph H. Johnson, Murphy, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/217,223

(22) Filed: Dec. 21, 1998

(51) Int. Cl.[7] .............................. H01S 5/00; H01S 3/08; H01L 29/06
(52) U.S. Cl. .............................. 372/45; 372/96; 257/13
(58) Field of Search .............................. 372/45, 46, 50, 372/96, 99; 257/13

(56) References Cited

U.S. PATENT DOCUMENTS

| | | | |
|---|---|---|---|
| 4,603,340 A | * | 7/1986 | Dil |
| 4,644,378 A | * | 2/1987 | Williams ...................... 372/46 |
| 4,787,089 A | * | 11/1988 | Hayakawa et al. ........... 372/45 |
| 5,040,186 A | * | 8/1991 | Logan et al. ................. 372/45 |
| 5,229,627 A | * | 7/1993 | Kosaka ......................... 372/45 |
| 5,251,225 A | | 10/1993 | Eglash et al. |
| 5,371,387 A | * | 12/1994 | Ando ......................... 257/192 |
| 5,383,211 A | | 1/1995 | Van de Walle et al. |
| 5,408,487 A | * | 4/1995 | Uchida et al. ................. 372/45 |
| 5,491,710 A | * | 2/1996 | Lo ............................... 372/45 |
| 5,557,627 A | | 9/1996 | Schneider, Jr. et al. |
| 5,559,818 A | | 9/1996 | Shono et al. |
| 5,583,351 A | | 12/1996 | Brown et al. |
| 5,719,894 A | * | 2/1998 | Jewell et al. ................. 372/45 |
| 5,719,895 A | | 2/1998 | Jewell et al. |
| 5,757,833 A | | 5/1998 | Arakawa et al. |
| 5,780,867 A | * | 7/1998 | Fritz et al. .................... 257/13 |
| 5,825,796 A | | 10/1998 | Jewell et al. |
| 6,252,894 B1 | | 6/2001 | Sasanuma et al. |
| 6,359,920 B1 | | 3/2002 | Jewell et al. |
| 6,363,092 B1 | | 3/2002 | Botez et al. |

FOREIGN PATENT DOCUMENTS

| | | |
|---|---|---|
| EP | 0 606 821 A | 7/1994 |
| JP | 08 139404 | 5/1996 |
| WO | PCT/US 99/26496 | 3/2000 |

OTHER PUBLICATIONS

Campbell, J. C., et al., "Quantum dot resonant cavity photodiode with operation near 1.3 μm wavelength", magazine article, Jul. 17, 1997, pps. 1337–1339, Electronics Letters, vol. 33, No. 15.

(List continued on next page.)

Primary Examiner—Quyen Leung
(74) Attorney, Agent, or Firm—Andrew A. Abeyta

(57) ABSTRACT

In order to achieve a long wavelength, 1.3 micron or above, VCSEL or other semiconductor laser, layers of strained quantum well material are supported by mechanical stabilizers which are nearly lattice matched with the GaAs substrate, or lattice mismatched in the opposite direction from the quantum well material; to allow the use of ordinary deposition materials and procedures. By interspersing thin, unstrained layers of e.g. gallium arsenide in the quantum well between the strained layers of e.g. InGaAs, the GaAs layers act as mechanical stabilizers keeping the InGaAs layers thin enough to prevent lattice relaxation of the InGaAs quantum well material. Through selection of the thickness and width of the mechanical stabilizers and strained quantum well layers in the quantum well, 1.3 micron and above wavelength lasing is achieved with use of high efficiency AlGaAs mirrors and standard gallium arsenide substrates.

5 Claims, 3 Drawing Sheets

OTHER PUBLICATIONS

Corzine, S. W., "Design of Vertical–Cavity Surface–Emitting Lasers with Strained and Unstrained quantum Well Active Regions", ECE Technical Report #93–09, May 1993, University of California at Santa Barbara.

Miller, B. I., et al., "Strain–compensated strained–layer superlattices for 1.5 μm wavelength lasers", magazine article, May 6, 1991, pps. 1952–1954, Appl. Phys. Lett. 58(18), American Institute of Physics.

Mirin, R. P., et al., "1.3 μm photoluminescence from InGaAs quantum dots on GaAs", magazine article, Dec. 18, 1995, pps. 3795–3797, Appl. Phys. Lett. 67 (25), American Institute of Physics.

Orenstein, M., et al., "Vertical–cavity surface–emitting InGaAs/GaAs Lasers with planar lateral definition", magazine article, Jun. 11, 1990, pps. 2384–2386, Appl. Phys. Lett. 56(24), American Institute of Physics.

Peter, M., et al., "Realization and modeling of pseudomorphic $(GaAs_{1-x}Sb_x-In_y Ga_{1-y}As)/GaAs$ bilayer–quantum well", magazine article, Oct. 30, 1995, pps. 2639–2641, Appl. Phys. Lett. 67(18), American Institute of Physics.

"Low Threshold 1.57μ VC–SEL's Using Strain–Compensated Quantum Wells and Oxide/Metal Backmirror", Chua et al., IEEE Photonics Technology letters, 7(1995) May, No. 5, pp. 444–446.

* cited by examiner

MECHANICAL STABILIZATION OF LATTICE MISMATCHED QUANTUM WELLS

BACKGROUND OF THE INVENTION

1. Field of the Invention

This invention relates to vertical cavity surface emitting lasers. The invention relates specifically to longer wavelength VCSELs such as 1.3 micrometer, or micron, ($\mu$m) wavelengths which can be made with ordinary MOCVD equipment or MBE equipment. In general it relates to obtaining light emission at wavelengths not normally obtainable with a given material system because of lattice mismatch.

2. Description of the Related Art

Vertical cavity surface emitting lasers (VCSEL) made with GaAs are known in the art which emit light in the 850 nanometer range. Because the quantum well for the short wavelength 850 nanometer VCSELs is made from GaAs (the same material as the substrate) the various epitaxially deposited layers, whose thickness is related to wavelength, are able to maintain the minimal mechanical strain without mechanical relaxation. However, if one were to use InGaAs in the active region at the larger 1.3 micron wavelengths, the lattice mismatch is so large the layers would tend to relax their strains and suffer dislocations, slip lines or island growth which would interfere with proper lasing.

In order to go to the proper bandgap for a 1.3 $\mu$m wavelength VCSEL one must use InGaAs or GaAsSb or some combination thereof instead of GaAs in the active layer. However, indiumgalliumarsenide and galliumaresenideantimonide are not the same lattice constant as GaAs at the compositions useful for 1.3 micron lasers. This makes it very difficult to build a proper quantum well structure.

It is therefore very desirable to come up with a quantum well (i.e. the active layer and the barrier layers surrounding it) which makes use of common GaAs, InGaAs or GaAsSb materials in construction of the 1.3 micron wavelength VCSEL.

SUMMARY OF THE INVENTION

The present invention extends the use of nonlattice matched quantum wells by extending the composition range over which they are mechanically stable. This is done by introducing thin regions, or mechanical stabilizers in the quantum well region, with the same lattice constant as the substrate while using thin layers of a semiconductor alloy of a different lattice constant in the quantum well structure. Alternatively, the lattice constant of the mechanical stabilizers may be nearly, eg. about ±2%, the same as that of the substrate, or mismatched in the opposite direction of the remainder of the quantum well material. The mechanical stabilizers are thin enough that their effect on the quantum well energy levels is small enough to be conveniently compensated for by modifying the composition, i.e. the indium to gallium ratio of the InGaAs layers or the arsenic to antimony ratio of GaAsSb or a combination of the above in InGaAsSb. A series of mechanical stabilizers is created within the quantum well structure. The effective quantum well energy level is that from the whole series of quantum well structures with mechanical stabilization layers therein. The effective quantum well energy level is modified only slightly by the presence of the mechanical stabilizers.

The mechanical stability is guaranteed by keeping the strained quantum well material between the stabilizers about or below the critical thickness as defined by Matthews and Blakeslee for nonlattice matched crystal growth. See for example p. 374 of 'Quantum Well Lasers,' Peter Zory, Academic Press 1993 for an interpretation of different critical thickness models including Matthews and Blakeslee. The mechanical stabilizers are unstrained since they are the same lattice constant as the substrate. The present invention may be generally used, but specifically applies to GaAs substrates; InGaAs, GaAsSb, or InGaAsSb quantum wells and GaAs mechanical stabilizers, or combinations thereof.

With the use of the mechanical stabilizers of the present invention active layer structures of the VCSEL may be built from common InGaAs or GaAsSb and GaAs materials used with ordinary MOCVD deposition equipment at layer thicknesses suitable for 1.3 micron wavelength emission without relaxation of mechanical strain; leading to reliable lasing in this wavelength with the use of common deposition methods and materials.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Figure 1:
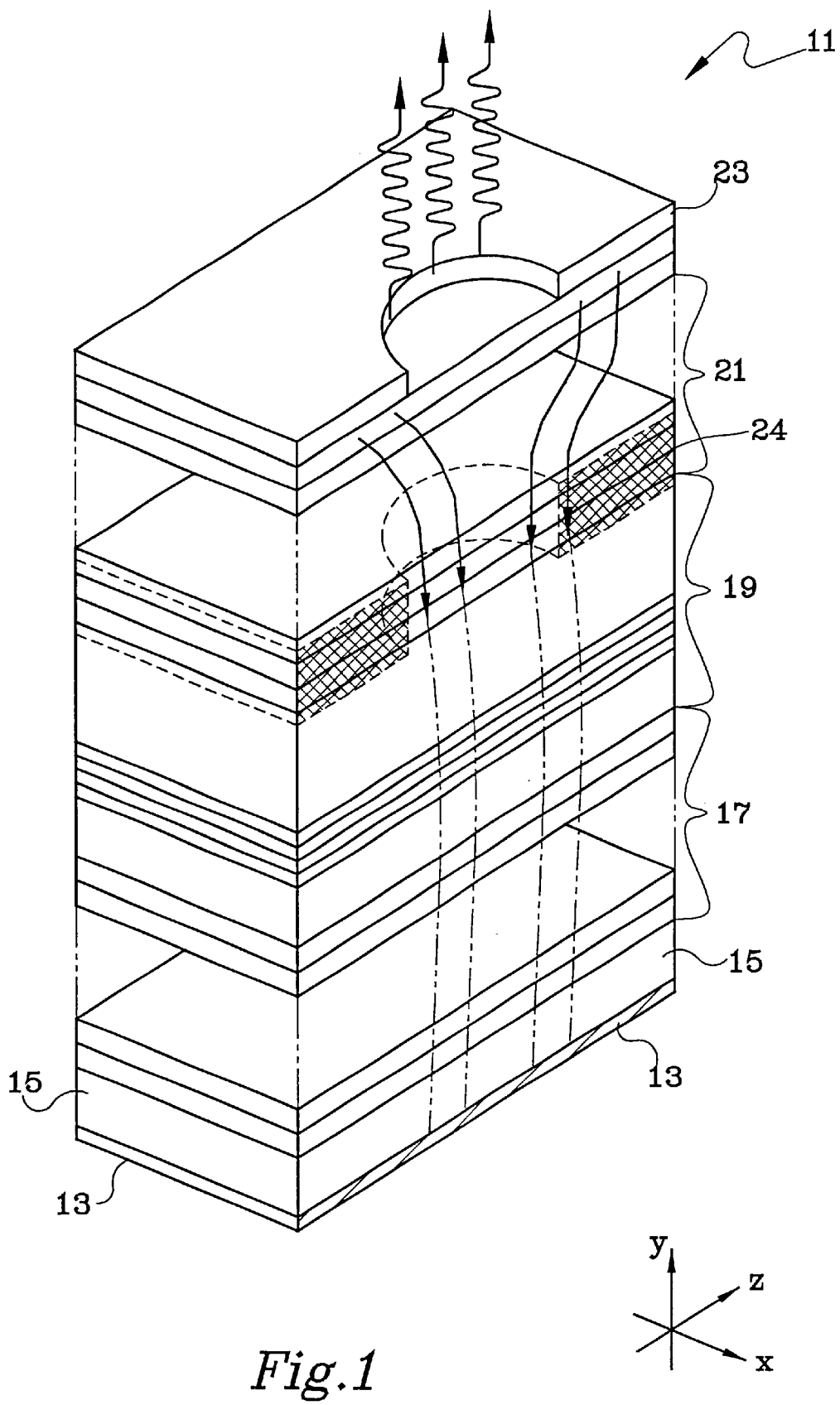
FIG. 1 is a schematic representation of a VCSEL according to the present invention.

Throughout the Description of the Preferred Embodiment, like components will be identified by like reference numerals.

As seen in FIG. 1, a VCSEL 11 has, as viewed from the bottom up, a metal-contact layer 13 adjacent and a first conductivity type, in this case N type, substrate 15 upon which is deposited an N type mirror stack 17. The active region 19 is adjacent the N type mirror stack and is comprised of GaAs barrier layers and InGaAs quantum well layer as further explained below. On top of the active layer, 19 is deposited a second conductivity type, in this case P type, mirror stack 21 upon which is deposited a P metal contact layer 23. A current blocking region 24, as known in the art is disposed in the P type mirror stack 21.

Although structures detailed in the preferred embodiment, except the active layer, are of ordinary construction; other structures or layers not detailed herein but known to those having ordinary skill in the art may of course be added to the structures presented herein.

As discussed above, there are certain problems with maintaining mechanical stress in long wavelength VCSEL layers necessary for 1.3 micron emission; when attempting to use GaAs substrates with InGaAs quantum well layers, and AlGaAs mirrors, i.e. common materials deposited through the use of common MOCVD equipment.

Figure 2:
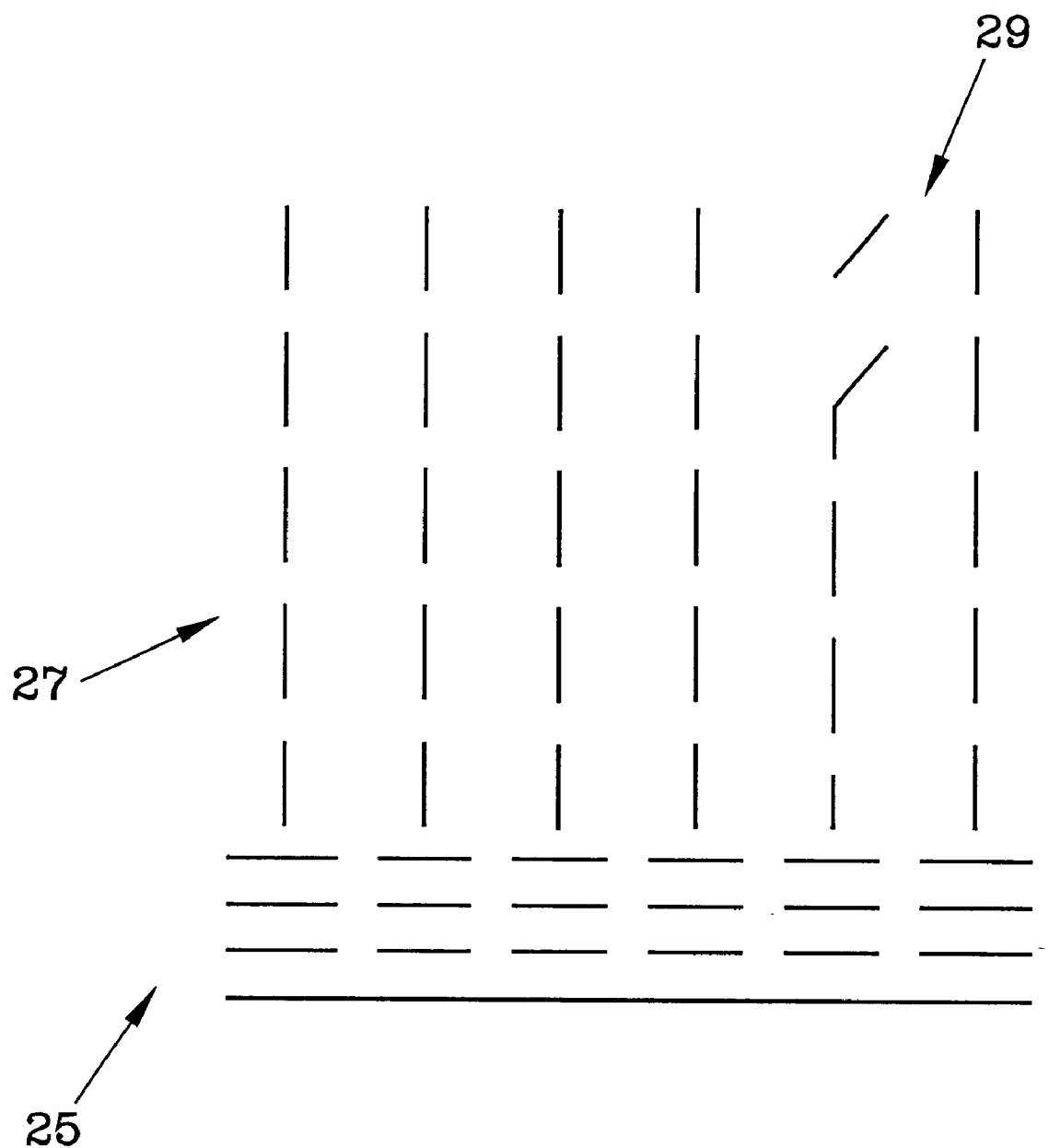
FIG. 2 is a schematic illustration of InGaAs lattice relaxation on a GaAs substrate.

As seen in FIG. 2, a schematic representation of a GaAs layer 25 upon which is deposited an InGaAs layer 27, because these two materials have different lattice constants, when one attempts to deposit too thick of a layer of InGaAs upon the GaAs layer beneath it, or substrate, at a certain point the mechanical strain of the InGaAs will relax, as at 29, causing a dislocation, slip line, or damage point which will negate or interfere with proper lasing activity. Unfortunately, a certain thickness must be maintained in order to obtain the proper energy levels to produce the longer wavelength lasing, i.e. 1.3 micron. Thus the InGaAs layers must be made thinner.

Figure 3:
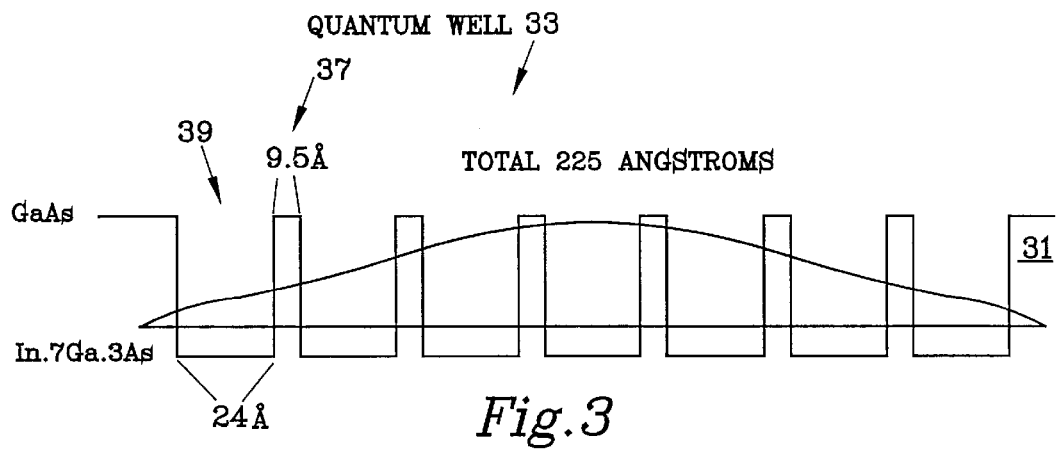
FIG. 3 is a schematic view of the energy bands versus depth of a active area portion of a 1.3 micron VCSEL according to the present invention.

As shown in FIG. 3, an energy versus position plot, a twohundredtwentyfive angstrom quantum well 33 is composed of InGaAs and surrounded on either side by barrier layers 31 composed of GaAs. Within the quantum well structure 33 are located six substantially equidistant, 9.5 Å thick, gallium arsenide spacer layers 37 surrounded by seven InGaAs layers 39 of approximately 24 Å thickness. A wavefunction line 30 and minimum allowable energy line 20 for the active region 19 are included in the plot. There may be other arrangements of GaAs spacer layers, such as two or four layers within the quantum wells, and it is probable that the InGaAs and GaAs layer widths will have to be multiples of the lattice constant. Thus the thickness of the quantum well may change slightly to achieve optimal lasing performance.

It will be noted that the mechanically stabilized quantum wave functions extend into the GaAs barrier layers 31. The dimensions are selected such that the lattice strain of the mechanically reinforced InGaAs layers 39 causes band splitting that modifies the InGaAs bandgap. The GaAs mechanical stabilizer layer thicknesses, the InGaAs layer thicknesses, the InGaAs composition and the total well thickness, or width, will determine the position of the quantum levels 19 relative to the band edge. However, it is believed that the dimensions shown are close approximations to desirable for indium 0.7 gallium 0.3 arsenide composition of the InGaAs layer.

Figure 4:
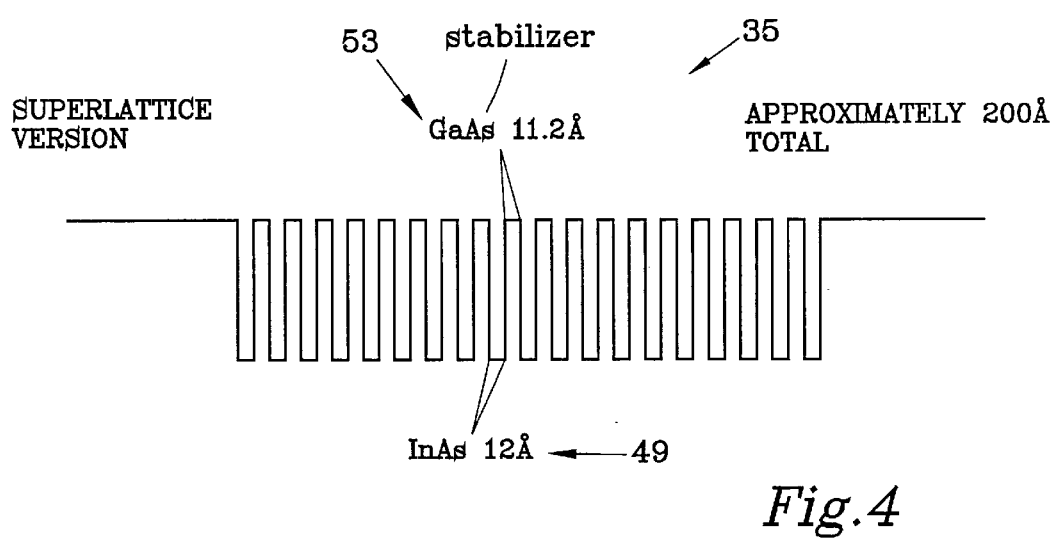
FIG. 4 is a schematic view of an alternative quantum well structure according to the present invention.

As shown in FIG. 4, alternative forms of a quantum well may be constructed according to the present invention. The quantum well 35 may be about twohundred angstroms wide with a superlattice of equidistant stabilization layers of 11.2 angstrom GaAs substrate material surrounded by InAs semiconductor alloy layers 49 of each about 12 angstroms.

The mechanical stabilization layered quantum wells according to the present invention are to be constructed using ordinarily known etching and deposition techniques for standard MOCVD equipment.

Figure 5:
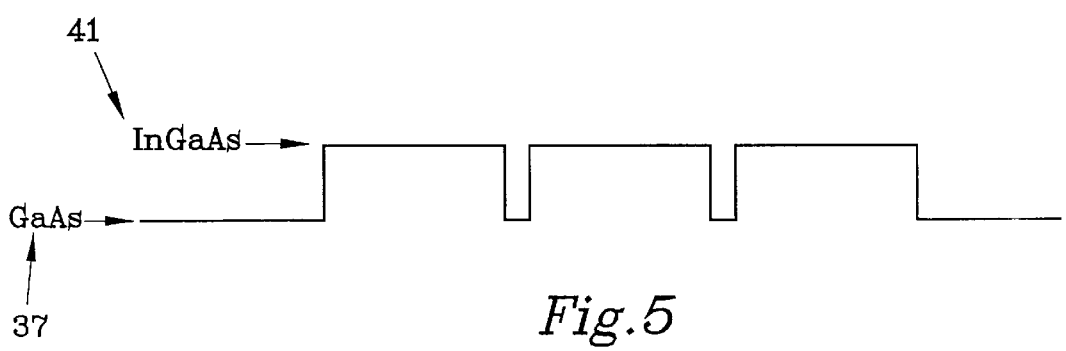
FIG. 5 is a schematic representation of the mechanical energy within the mechanically stabilized InGaAs quantum well using the GaAs stabilization layers.

The quantum wells of the present invention are surrounded by GaAs barrier layers upon which it is suitable to deposit high efficiency AlGaAs mirrors whose lattice constant matches that of the GaAs barrier layers. A mechanical energy graph representation line 41 is shown in FIG. 5 to illustrate that the strain is kept on the InGaAs layer at a level above that of the GaAs mechanical stabilizers 37 which is in an unstrained state due to lattice constant matching. During the growth process the strained epitaxial layer follows the lattice constant of the substrate until it passes the critical thickness. At this thickness instead of maintaining the strain it is relaxed with dislocations. By keeping the thickness under the critical thickness the layers do not relax and form dislocations. The GaAs mechanical stabilizers are not strained because they follow the lattice constant of the substrate. Growing the following InGaAs layer on the GaAs mechanical stabilizer is identical to growing it on the substrate.

Thus by following the teachings of the present invention a 1.3 micron wavelength VCSEL may be manufactured utilizing quantum wells of InGaAs, or other semiconductor compounds, with gallium arsenide mechanical stabilization layers in order to keep the semiconductor layers thin enough to maintain mechanical strain while utilizing common AlGaAs mirror structures.

I claim:

1. A vertical cavity semiconductor laser emitting device comprising a GaAs substrate and an active region having a thickness between about 200 Å and 225 Å, said active region further comprising at least one quantum well including seven InGaAs alloy layers each having a thickness of about 24 Å, each of said InGaAs alloy layers separated by GaAs spacer layers having a thickness of about 9.5 Å thick and having the same lattice constant as said GaAs substrate, wherein the GaAs spacer layers serve as mechanical stabilizers for the InGaAs alloy layers to prevent them from relaxing, thereby promoting stabilization within the quantum well.

2. The device of claim 1, said quantum well further comprising Sb within said quantum well.

3. A semiconductor light emitting device comprising:
   a GaAs substrate; and
   an active layer including at least one quantum well having a thickness of about 200 Å to 225 Å and, the quantum well further comprising at least nineteen InAs alloy layers having a thickness of about 12 Å and each being separated by GaAs spacer layers having a thickness of about 11.2 Å and having the same lattice constant as the GaAs substrate;
   wherein the GaAs spacer layers serve as mechanical stabilizers for the InAs alloy layers to prevent them from relaxing, thereby promoting stabilization within the quantum well.

4. A semiconductor light emitting device according to claim 3 wherein the device is one of a vertical cavity laser, an edge emitting laser, or a light emitting diode.

5. The device of claim 3 further including Sb with said InAs alloy layers.

* * * * *